(12) United States Patent
Rai et al.

(10) Patent No.: US 12,405,623 B2
(45) Date of Patent: Sep. 2, 2025

(54) AMPLIFIER HAVING TRANSCONDUCTANCE ATTENUATION

(71) Applicant: TEXAS INSTRUMENTS INCORPORATED, Dallas, TX (US)

(72) Inventors: Saurabh Rai, Bangalore (IN); Ramakrishna Ankamreddi, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 306 days.

(21) Appl. No.: 18/059,720

(22) Filed: Nov. 29, 2022

(65) Prior Publication Data

US 2024/0094754 A1 Mar. 21, 2024

(30) Foreign Application Priority Data

Sep. 20, 2022 (IN) .............................. 202241053653

(51) Int. Cl.
 *G05F 1/575* (2006.01)
 *H03F 3/45* (2006.01)
(52) U.S. Cl.
 CPC .......... *G05F 1/575* (2013.01); *H03F 3/45179* (2013.01)
(58) Field of Classification Search
 CPC ... G05F 1/10; G05F 1/56; G05F 1/575; H03F 3/45179
 See application file for complete search history.

(56) References Cited

U.S. PATENT DOCUMENTS

| 7,091,757 | B2 * | 8/2006 | Masuda | H03B 19/00 327/119 |
| 9,030,186 | B2 * | 5/2015 | Gupta | G05F 3/30 323/901 |
| 2016/0291621 | A1 * | 10/2016 | Whidden | G05F 1/577 |
| 2020/0012303 | A1 * | 1/2020 | Stanzione | G05F 1/565 |

FOREIGN PATENT DOCUMENTS

CN 118199531 A * 6/2024 ............. H03F 1/523

* cited by examiner

*Primary Examiner* — Adolf D Berhane
(74) *Attorney, Agent, or Firm* — Charles F. Koch; Frank D. Cimino

(57) ABSTRACT

An error amplifier includes a first transistor having a first error amplifier input and having first and second current terminals, a second transistor having a second error amplifier input and having third and fourth current terminals, a first resistor coupled between a supply voltage terminal and the first current terminal, and a second resistor coupled between the supply voltage terminal and the third current terminal. The error amplifier has a second stage circuit coupled to the first and second resistors. The second stage circuit has an error amplifier output. The second stage circuit is configured to cause less current to flow through the second stage circuit than a current that flows through either of the first or second resistors or the first or second transistors.

16 Claims, 5 Drawing Sheets

AMPLIFIER HAVING TRANSCONDUCTANCE ATTENUATION

CROSS REFERENCE TO RELATED APPLICATION

This application claims priority to India provisional patent application No. 202241053653 entitled "Ultra-Low Noise Amplifier With Tunable Unity-Gain Bandwidth Using Transconductance Attenuation," incorporated herein by reference.

BACKGROUND

A voltage regulator is a circuit that produces an output voltage that is regulated to a target value (within a specified level of output voltage ripple). One type of voltage regulator is a "low drop-out" (LDO) voltage regulator in which an error amplifier amplifies the difference between the output voltage and a reference voltage to produce an error signal. The error signal is coupled to a gate of a field effect transistor (FET). The FET may be a p-channel FET (PFET). The source of the PFET may be coupled to the input voltage. By controlling the gate voltage of the PFET, the gate-to-source voltage (Vgs) of the PFET is controlled to maintain a current magnitude through the PFET to a load. If the output voltage increases, the error signal increases as well, thereby decreasing the PFET's Vgs, which in turn decreases the load current, and the output voltage decreases. Similarly, if the output voltage decreases, the error signal decreases, thereby increasing the PFET's Vgs, which in turn increases the load current, and the output voltage increases.

SUMMARY

An error amplifier includes a first transistor having a first error amplifier input and having first and second current terminals, a second transistor having a second error amplifier input and having third and fourth current terminals, a first resistor coupled between a supply voltage terminal and the first current terminal, and a second resistor coupled between the supply voltage terminal and the third current terminal. The error amplifier has a second stage circuit coupled to the first and second resistors. The second stage circuit has an error amplifier output. The second stage circuit is configured to cause less current to flow through the second stage circuit than a current that flows through either of the first or second resistors or the first or second transistors.

DETAILED DESCRIPTION

Figure 1:
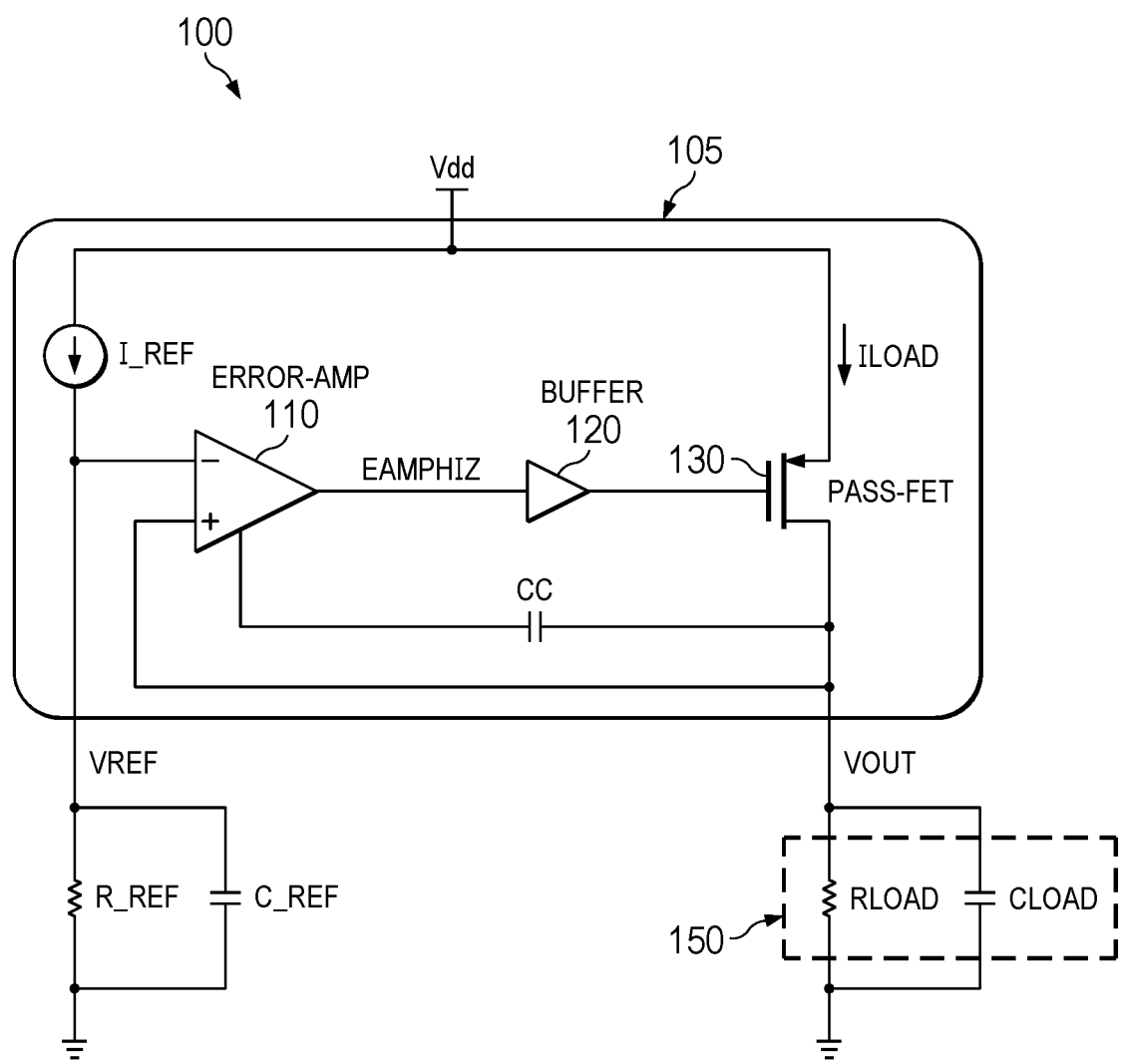
FIG. 1 is a schematic of a low-dropout (LDO) voltage regulator, in accordance with an example embodiment.

The same reference numbers or other reference designators are used in the drawings to designate the same or similar (either by function and/or structure) features.

FIG. 1 is a schematic diagram of a voltage regulator 100. In this example, the voltage regulator is an LDO voltage regulator including an error amplifier 110, a buffer 120, a transistor 130, a capacitor CC, a current source circuit I_REF, resistor R_REF, and capacitor C_REF. A load 150 receives an output voltage VOUT form the voltage regulator 100. The load 150 can be modeled as a resistance RLOAD in parallel with a capacitance CLOAD.

In this example, the transistor 130 is a PFET. The current, ILOAD, to the load 150 passes through the transistor 130. The transistor 130 may be referred to as a "pass-FET," and is referred to herein as pass-FET 130. The source of the pass-FET 130 is coupled to the input supply voltage, Vdd. The drain of the pass-FET is coupled to the load 150. The voltage on the drain of the pass-FET 130 is VOUT.

The error amplifier 110 includes a negative (inverting, −) input and a positive (non-inverting, +) input. The output voltage VOUT is coupled to the positive input of the error amplifier 110. The current source circuit I_REF produces a fixed current (also called I_REF). The current source circuit I_REF is coupled to the parallel combination of resistor R_REF and capacitor C_REF. Current I_REF charges capacitor C_REF to a fixed voltage, VREF. The negative input of the error amplifier 110 receives the reference voltage VREF. The capacitor CC is coupled between the drain of pass-FET 130 and an internal terminal within the error amplifier 110. Capacitor CC is a compensation capacitor.

The error amplifier 110 amplifies the difference between VOUT and VREF. The output signal from the error amplifier 110 is an error signal designated EAMPHIZ. Error signal EAMPHIZ is proportional to the difference between VOUT and VREF. Error signal EAMPHIZ is provided to an input of buffer 120. Buffer 120 may convert EAMPHIZ to a voltage suitable for driving the gate of the pass-FET 130. As VOUT increases, the magnitude of EAMPHIZ also increases. An increasing EAPHIZ causes the Vgs of the pass-FET to decrease, thereby causing the magnitude of ILOAD to decrease to the load 150, and VOUT decreases in response. A decreasing EAPHIZ causes the Vgs of the pass-FET to increase, thereby causing the magnitude of ILOAD to increase to the load 150, and VOUT increases in response.

In one embodiment, the error amplifier 110, buffer 120, pass-FET 130, capacitor CC, and current source circuit I_REF are fabricated on a semiconductor die 105, and resistor R_REF and capacitor C_REF are external to the semiconductor die 105. The load 150 is external to the semiconductor die 105 as well. In other embodiments resistor R_REF and capacitor C_REF may be fabricated on the same semiconductor die 105 as the error amplifier 110, buffer 120, pass-FET 130, capacitor CC, and current source circuit I_REF.

Figure 2:
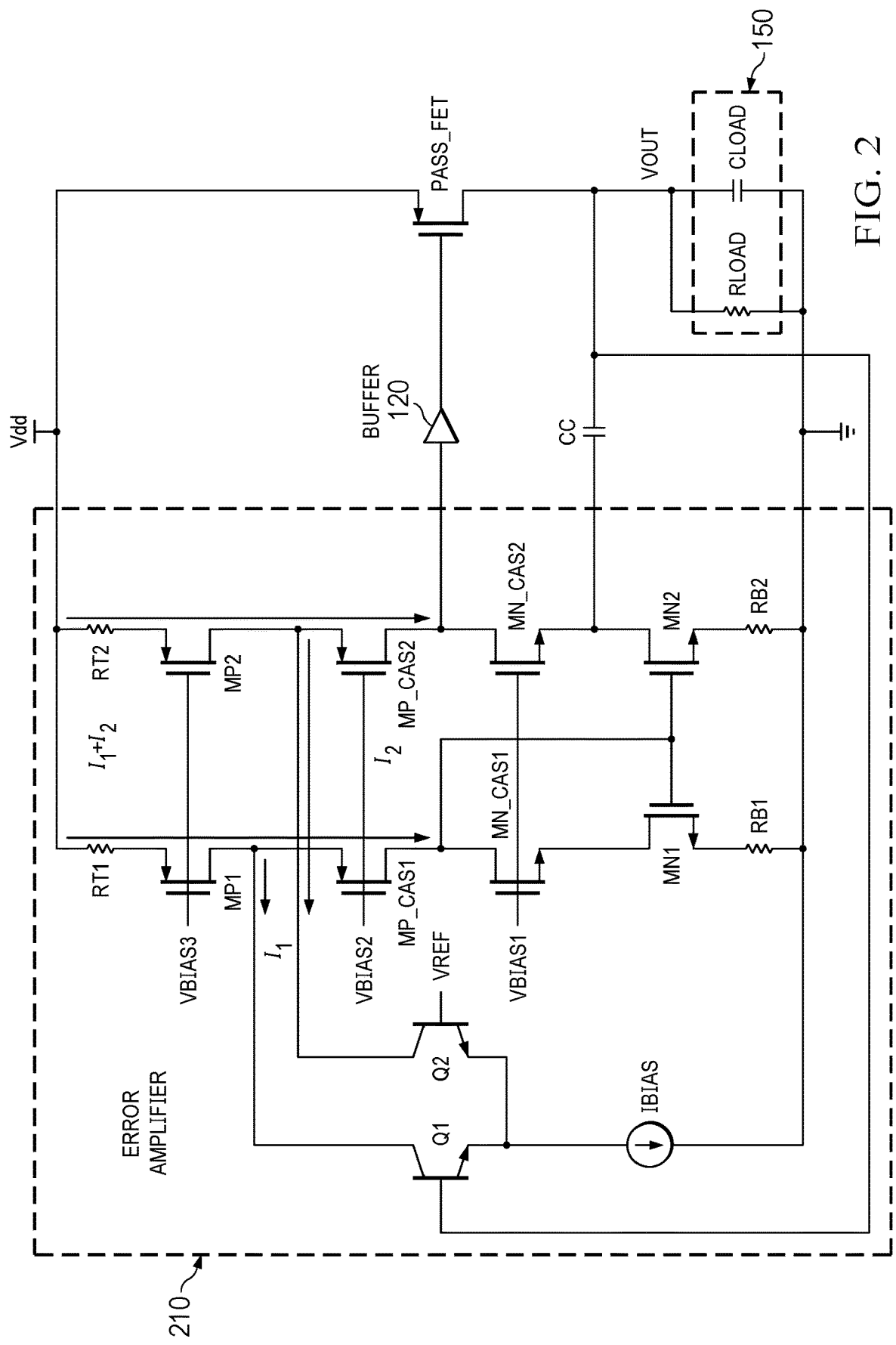
FIG. 2 is a schematic diagram of an example error amplifier usable in the LDO voltage regulator of FIG. 1.

FIG. 2 is a schematic of an error amplifier 210, which can be used to implement error amplifier 110 in the LDO 100 of FIG. 1. Error amplifier 210 includes multiple stages. A first stage includes a bias current source (BIAS and an input pair of transistors Q1 and Q2. A second stage includes resistors RT1, RT2, RB1, and RB2, and transistors MP1, MP2, MP_CAS1, MP_CAS2, MN_CAS1, MN_CAS2, MN1, and MN2. In this example, transistors Q1 and Q2 are NPN bipolar junction transistors (BJTs), and the transistors of the second stage are field effect transistors (FETs). Transistors MP1, MP2, MP_CAS1, and MP_CAS2 are p-channel FETs (PFETs), and transistors MN_CAS1, MN_CAS2, MN1, and MN2 are n-channel FETs (NFETs).

The inputs to the first stage transistors are the bases of transistors Q1 and Q2. The base of transistor Q1 is coupled to VOUT. The base of transistor Q2 is VREF. The emitters of transistors Q1 and Q2 are coupled together and to current source (BIAS. The current IBIAS ('IBIAS' refers both to the circuit that produces the current as well as the magnitude of that current) divides between transistors Q1 and Q2 based on the relative magnitude of the voltages on the bases (VOUT versus VREF). If the voltage VOUT is larger than the voltage VREF, then more of the bias current (BIAS flows through transistor Q1 than through transistor Q2. Conversely, if the voltage VREF is larger than the voltage VOUT, then more of the bias current (BIAS flows through transistor Q2 than through transistor Q1. Current I1 represents the currents that flow through the transistors Q1 and Q2.

In the second stage, resistor Rt1, transistors MP1, MP_CAS1, MN_CAS1, and MN1, and resistor RB1 are coupled in series between Vdd and ground. Similarly, resistor Rt2, transistors MP2, MP_CAS2, MN_CAS2, and MN2, and resistor RB2 are coupled in series between Vdd and ground. A bias voltage VBIAS3 is coupled to the gates of transistors MP1 and MP2. A bias voltage VBIAS2 is coupled to the gates of transistors MP_CAS1 and MP_CAS2. A bias voltage VBIAS1 is coupled to the gates of transistors MN1 and MMN2. The gates of transistors MN1 and MN2 are coupled together and to the drain of transistor MN_CAS1. Capacitor CC is coupled between VOUT and the drain of transistor MN2. The drains of transistors MP_CAS2 and MN_CAS2 are coupled together and provide the output voltage from the second stage to the input of buffer 120.

The drain of transistor MP1 is coupled to the source of transistor MP_CAS1 and to the collector of transistor Q1. The drain of transistor MP2 is coupled to the source of transistor MP_CAS2 and to the collector of transistor Q2. The current that flows through the transistors of the second stage is identified as current I2. The configuration of the error amplifier 210 is such that current that flows through resistors RT1 and RT2 and transistors MP1 and MP2 is the sum of currents I1 and I2. To decrease the noise produced by the first stage's input pair of transistors Q1 and Q2, the IBIAS current can be increased. The increase in IBIAS increases I1 and thus also increases the sum of currents I1 and I2. By increasing the current I1 to decrease the noise of the first stage transistors Q1 and Q2, the current through transistors MP1 and MP2 also increases. Transistors MP1 and MP2 are sized to accommodate the bias current IBIAS through transistors Q1 and Q2. Further, to reduce flicker noise produced by transistors, MP1 and MP2, their current densities should be reduced which means their size should be increased. Thus, transistors MP1 and MP2 are relatively large transistors to accommodate the bias current of the first stage as well as to reduce their own flicker noise.

Increasing bias current through the input pair of transistors Q1 and Q2 causes an increase in the transconductance (gm) of the input pair of transistors. Also, the unity gain bandwidth (UGB) of the amplifier 210 is proportional to gm/CC. Accordingly, increasing the bias current through the input pair of transistors Q1 and Q2 causes an increase in the amplifier's UGB. The UGB may increase to the point that a non-dominant pole may be within the UGB thereby adding a second pole to the system. Such an additional pole causes the phase to roll-off at an increased rate of 90 degrees per decade at the frequency of the second. A more rapidly falling phase may result in the phase margin (the phase angle at which the gain is at 0 dB (unity gain)) being negative. A positive phase margin renders the system stable, but a negative phase margin renders the system unstable. Thus, an increase in the bias current through the input pair of transistors Q1 and Q2 causes less noise in the input pair but may increase the UGB and undesirably resulting in the phase margin being negative (unstable system).

Figure 3:
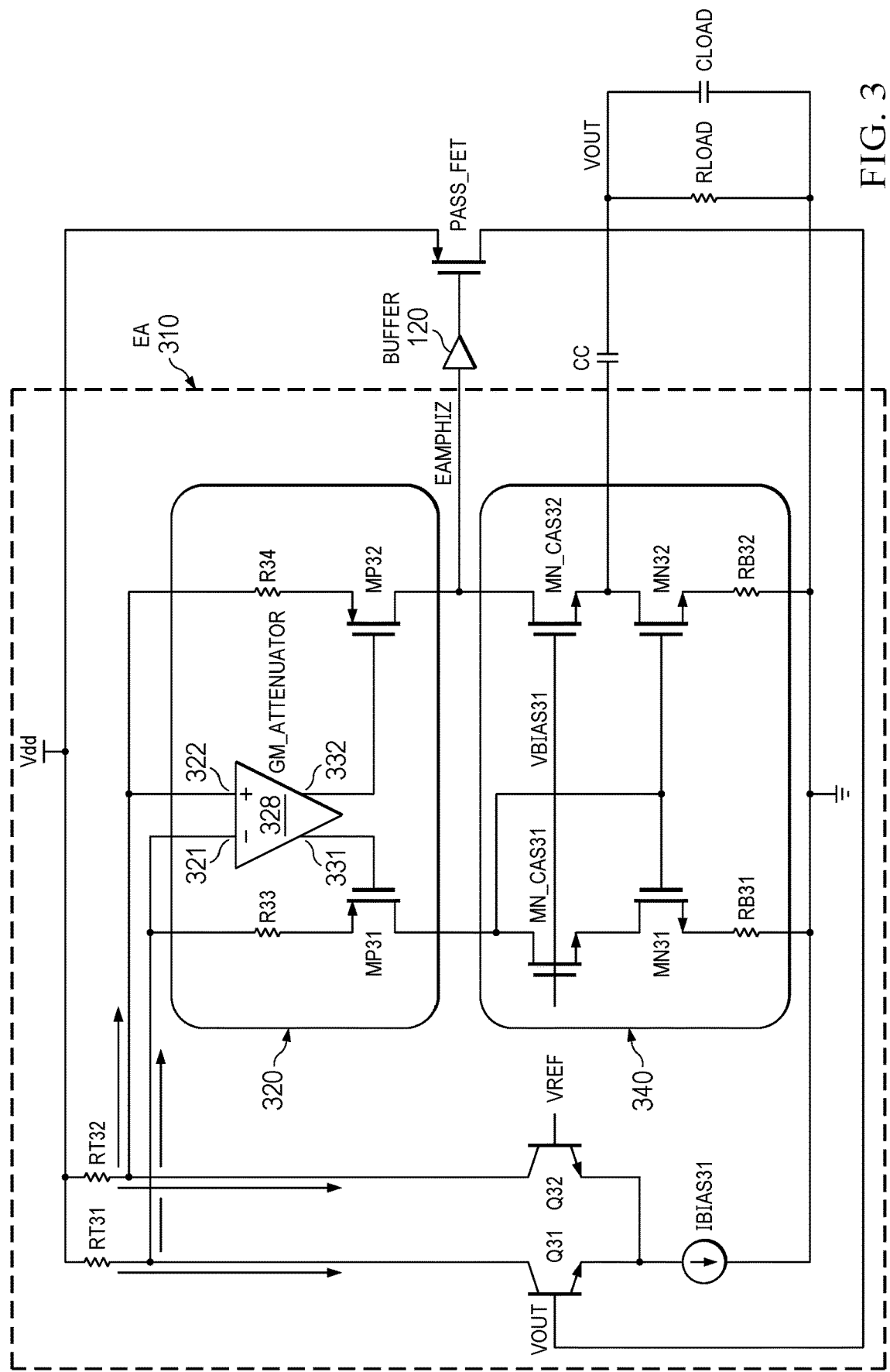
FIG. 3 is a schematic diagram of another example error amplifier usable in the LDO voltage regulator of FIG. 1.

FIG. 3 is a schematic of an error amplifier 310, which also can be used to implement error amplifier 110 in the LDO 100 of FIG. 1. Error amplifier 310 includes multiple stages. Like error amplifier 210, error amplifier 310 includes a first stage that has a bias current source IBIAS31 and an input pair of transistors Q31 and Q32. The error amplifier 310 also includes second stage circuits 320 and 340. Resistor R31 is coupled between Vdd and the collector of transistor Q31. Resistor R32 is coupled between Vdd and the collector of transistor Q32.

Second stage circuit 340 is a cascode circuit coupled between the second stage circuit 320 and ground. The second stage circuit 340 includes transistors (NFETs) MN_CAS31, MN_CAS32 and MN31 and MN32, and resistors RB31 and RB32. Resistors RB31 and RB32 couple between the sources of the respective transistors MN31 and MN32 and ground, as shown. The gates of transistors MN_CAS31 and MN_CAS32 are coupled to a bias voltage VBIAS31. The gates of transistors MN31 and MN32 are coupled together and to the drain of transistor MN_CAS31.

The second stage circuit 320 includes resistors R33 and R34, transistors (PFETs) MP31 and MP32, and a transconductance attenuator circuit 328. The transconductance attenuator circuit 328 includes a negative input 321 and a positive input 322. The negative input of the transconductance attenuator circuit 328 is coupled to the collector of transistor Q1 and to resistor RT31. The negative input of the transconductance attenuator circuit 328 is coupled to the collector of transistor Q2 and to resistor RT32. Resistor R33 is coupled between the negative input of the transconductance attenuator circuit 328 and the source of transistor MP31. Resistor R34 is coupled between the positive input of the transconductance attenuator circuit 328 and the source of transistor MP32. The transconductance attenuator circuit has outputs 331 and 332 which are coupled to the respective gates of transistors MP31 and MP32, as shown.

The bias current IBIAS31 that flows through the combination of transistors Q31 and Q32 flows through resistors RT31 and RT32 but does not also flow through the second stage circuit 320. Accordingly, increasing the bias current through the input pair of transistors Q1 and Q2 to reduce the noise of those transistors does not also result in an increase in the current through the second stage circuit 320. In one example, the bias current through transistors MP31 and MP32 is 40 microamperes whereas the bias current IBIAS31 is 3 mA. Advantageously, transistors MP31 and MP32 can be smaller than transistors than MP1 and MP2 for the same amount of flicker noise and the thermal noise of transistors MP31 and MP32 will also be lower than the thermal noise of transistors MP1 and MP2 due to the lower bias current in the second stage circuit 320, all else being equal. To lower the noise, the current through transistors Q31 and Q32 can be increased without further loading the second stage circuit 320 and increasing the thermal and flicker noise of transistors MP31 and MP32.

Further, the PFETs MP31 and MP32 function as a pseudo input pair, and the LDO's UGB is proportional to A*gm2/CC, where gm2 is the transconductance of transistors MP31 and MP32, A is the gain of the first stage. The first stage gain A=gm1*RT31, where gm1 is the transconductance of transistors Q1 and Q2. The transconductance of BJTs is proportional to the current through the BJT. The transconductance of a FET (e.g., MP31, MP32) is proportional to the square root of its drain current. The bias current through the transistors MP31 and MP32 is much smaller than the bias current through transistors Q31 and Q32 and thus gm2 is substantially smaller than gm1. Accordingly, the UGB of the error amplifier 310 is advantageously substantially smaller than the UGB of error amplifier 210, and any non-dominant poles are not likely to be outside the UGB of error amplifier 310. As a result, error amplifier 310 is more likely to be stable and have significantly less overall noise than for error amplifier 210.

The transconductance attenuator 328 has a gain of Ap, which is a value greater than 1. The transconductance attenuator 328 causes the effective gm2 to be scaled by a factor of (1−Ap). Accordingly, the effective transconductance (gm2eff) of the second stage circuit 320 is gm2eff=gmp*(1−Ap), where gmp is the transconductance of the transistors MP31 and MP32. Because the value Ap is less than 1, the effective transconductance, gm2eff, is less than the actual transconductance of the of transistors MP31 and MP32. The transconductance attenuator 328 also helps to reduce of the LDO noise while increasing stability by having higher current in the first stage (transistors Q31 and Q32) than in the second stage circuit and increasing the gain of the first stage. Increasing the gain of the first stage divides the noise resulting from the second stage circuit 320 while maintaining the UGB by tuning the gain Ap of the transconductance attenuator and lowering the value of gm2eff. The tunability of the gain Ap of the transconductance attenuator 328 is described below with respect to FIG. 4.

The example error amplifier 310 of FIG. 3 is more likely to be stable and have significantly less overall noise than for error amplifier 210. In one example, the UGB of error amplifier is 2 MHz and has an overall noise value of 0.45 microvolts rms (root mean square).

Figure 4:
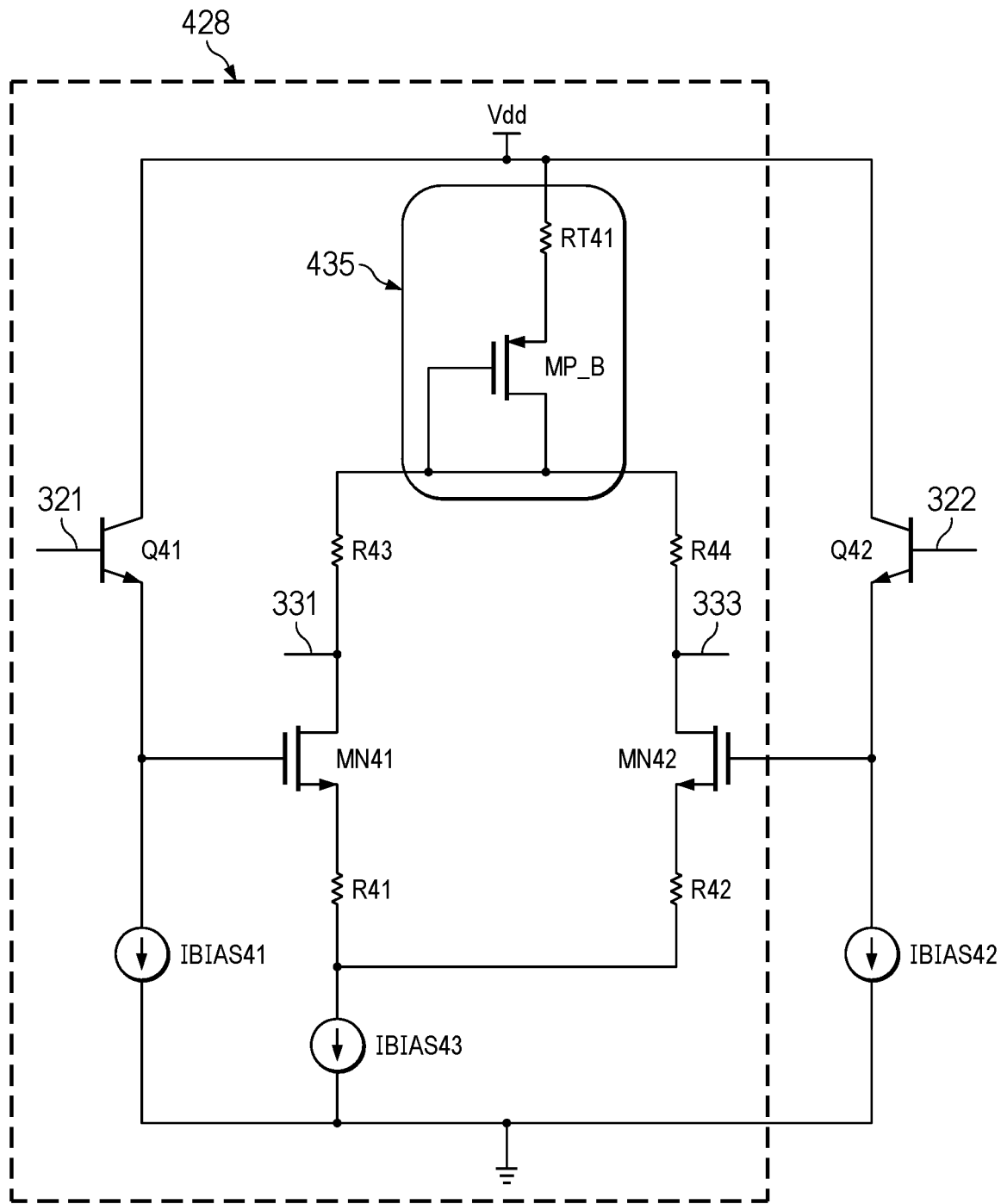
FIG. 4 is a schematic diagram of an example transconductance attenuator usable in the error amplifier of FIG. 3.

FIG. 4 is a schematic of transconductance attenuator 428, which can be used to implement the transconductance attenuator 328 of FIG. 3. In this example, transconductance attenuator 428 includes input transistors (NPN BJTs) 041 and Q42 whose bases are the transconductance attenuator's inputs 321 and 322. The transconductance attenuator 428 also includes transistors MN41 and MN42 (NFETs), resistors R41, R42, R43, R44, and RT41, and current sources IBIAS41, IBIAS42, and IBIAS43.

Resistor RT41 couples to the source of transistor MP_B to form a bias voltage circuit 435. Resistor R43, transistor MN41, and resistor R41 are coupled in series between the bias voltage circuit 435 and current source IBIAS43. Similarly, resistor R44, transistor MN42, and resistor R42 are coupled in series between the bias voltage circuit 435 and current source IBIAS43. Current sources IBIAS41 and IBIAS42 provide a bias current through the transistors Q41 and Q42. The collectors of transistors Q41 and Q42 coupled to Vdd. The emitter of transistor Q41 is coupled to the gate of transistor MN41, and the emitter of transistor Q42 is coupled to the gate of transistor MN42. Transistors Q41 and Q42 function as emitter-followers in which their emitter voltage follows the magnitude of their base voltage (1*Vbe below the base voltage). The resistances of resistors R43 and R44 is approximately the same. Similarly, the resistances of resistors R41 and R42 is approximately the same. The outputs 331 and 333 are taken from the drains of transistors MN41 and MN42 as shown. The gain of the transconductance attenuator 428 (e.g., voltage on output 331 divided by voltage on input 321) is proportional to product of the resistance of resistor R43 and the transconductance of transistor MN41 (which is degenerated by resistor R41).

The tunability of the gain of the transconductance attenuator 428 depends upon the effective transconductance of transistors MN41 and MN42, which are degenerated by corresponding resistors R41 and R42. The effective transconductance is a function of the resistance of resistors R41 and R42 and the resistance of resistors R43 and R44. The gain Ap of the transconductance amplifier 428 is proportional to the ratio of the resistance of resistor R43 (or R44) to the resistance of resistor R41 (or R42). The gain Ap can be tuned by changing resistor R43 (R44) and/or resistor R41 (R42) so that the aforementioned ratio is changed. Accordingly, the UGB of the error amplifier 310 can be tuned. In one embodiment, resistors R43/R44 and/or resistors R41/R42 are trimmable (e.g., multiple resistors coupled in series with corresponding switches controlled by a trim code).

Figure 5:
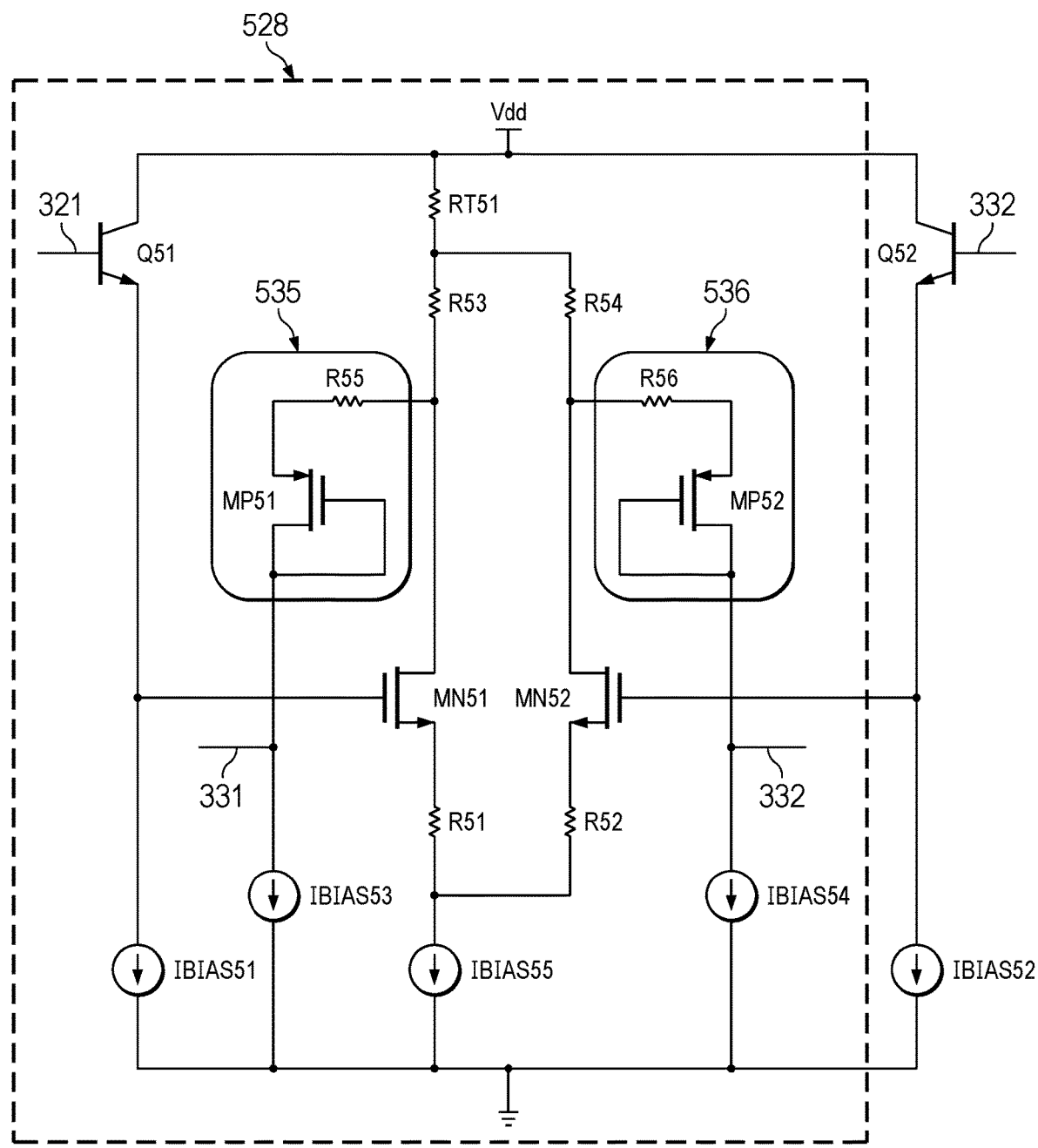
FIG. 5 is a schematic diagram of another example transconductance attenuator usable in the error amplifier of FIG. 3.

FIG. 5 is a schematic of transconductance attenuator 528, which also can be used to implement the transconductance attenuator 328 of FIG. 3. In this example, transconductance attenuator 528 includes input transistors (NPN BJTs) Q51 and Q52 whose bases are the transconductance attenuator's inputs 321 and 322. The transconductance attenuator 528 also includes transistors MN51 and MN52 (NFETs) and transistors MP51 and MP52 (PFETs), resistors R51, R52, R53, R54, R55, R56, and RT51, and current sources IBIAS51, IBIAS52, IBIAS53, IBIAS54, and IBIAS55.

Resistor R55 couples to the source of transistor MP51 to form a bias voltage circuit 535. Resistor R56 couples to the source of transistor MP52 to form a bias voltage circuit 536. Current source IBIAS53 provides a bias current through the bias voltage circuit 535. Current source IBIAS54 provides a bias current through the bias voltage circuit 536. The outputs 331 and 332 are the drains of the respective transistors MP51 and MP52.

Resistor R53, transistor MN51, and resistor R52 are coupled in series between resistor RT51 and current source IBIAS55. Similarly, resistor R54, transistor MN52, and resistor R52 are coupled in series between resistor RT51 and current source IBIAS55. Current sources IBIAS51 and IBIAS52 provide the bias current through the transistors Q51 and Q52. The collectors of transistors Q51 and Q52 coupled to Vdd. The emitter of transistor Q51 is coupled to the gate of transistor MN51, and the emitter of transistor Q52 is coupled to the gate of transistor MN52. Transistors Q41 and Q42 function as emitter-followers in which their emitter voltage follows the magnitude of their base voltage (1*Vbe below the base voltage). The resistances of resistors R53 and R54 is approximately the same. Similarly, the resistances of resistors R51 and R52 is approximately the same. The gain of the transconductance attenuator 528 is proportional to the product of the resistance of resistor R53 and the transconductance of transistor MN51 (which is degenerated by resistor R51).

The value of Vdd for transconductance attenuator 428 is higher than for transconductance attenuator 528 due to the extra headroom required to accommodate the bias voltage circuit 435. However, because transconductance attenuator 528 has an extra bias voltage circuit with respect to transconductance attenuator 428, the total noise produced by transconductance attenuator 428 will be lower than the noise produced by transconductance attenuator 528.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "on" means that the conduction channel of the FET is present and drain current may flow through the FET. References herein to a FET being "off" means that the conduction channel is not present and drain current does not flow through the FET. An "off" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. An error amplifier, comprising:
   a first transistor having a first error amplifier input and having first and second current terminals;
   a second transistor having a second error amplifier input and having third and fourth current terminals;
   a first resistor coupled between a supply voltage terminal and the first current terminal;
   a second resistor coupled between the supply voltage terminal and the third current terminal;
   a circuit coupled to the first and second resistors, the circuit having an error amplifier output, the circuit configured to cause less current to flow through the circuit than a current that flows through either of the first or second resistors or the first or second transistors;
   a third transistor having a third control input and fifth and sixth current terminals, the fifth current terminal coupled to the first resistor;
   a fourth transistor having a fourth control input and seventh and eighth current terminals, the seventh current terminal coupled to the second resistor;
   a third resistor coupled between the first resistor and the fifth current terminal; and
   a fourth resistor coupled between the second resistor and the seventh current terminal.

2. The error amplifier of claim 1, further comprising an attenuator circuit, the attenuator circuit including a first attenuator circuit input, a second attenuator circuit input, a first attenuator circuit output, and a second attenuator circuit output, the first attenuator circuit input coupled to the first resistor and to the first current terminal, the second attenuator circuit input coupled to the second resistor and to the third current terminal, the first attenuator circuit output coupled to the third control input, and the second attenuator circuit output coupled to the fourth control input.

3. The error amplifier of claim 2, wherein the attenuator circuit includes:
   a fifth transistor having a fifth control input and ninth and tenth current terminals, the ninth current terminal coupled to the third control input;
   a sixth transistor having a sixth control input and eleventh and twelfth current terminals, the eleventh current terminal coupled to the fourth control input;
   a seventh transistor having a seventh control input and thirteenth and fourteenth current terminals, the seventh control input coupled to the first current terminal and the first resistor, and the fourteenth current terminal coupled to the fifth control input;
   an eighth transistor having an eighth control input and fifteenth and sixteenth current terminals, the eighth control input coupled to the third current terminal and the second resistor, and the sixteenth current terminal coupled to the sixth control input;
   a bias voltage circuit;
   a third resistor coupled between the bias voltage circuit and the ninth current terminal; and
   a fourth resistor coupled between the bias voltage circuit and the eleventh current terminal.

4. The error amplifier of claim 2, wherein the attenuator circuit includes:
   a fifth transistor having a fifth control input and ninth and tenth current terminals;
   a sixth transistor having a sixth control input and eleventh and twelfth current terminals;
   a seventh transistor having a seventh control input and thirteenth and fourteenth current terminals, the seventh control input coupled to the first current terminal and the first resistor, and the fourteenth current terminal coupled to the fifth control input;
   an eighth transistor having an eighth control input and fifteenth and sixteenth current terminals, the eighth control input coupled to the third current terminal and the second resistor, and the sixteenth current terminal coupled to the sixth control input;
   a third resistor;
   a fourth resistor;
   a first bias voltage circuit coupled to the third resistor and the ninth current terminal; and
   a second bias voltage circuit coupled to the fourth resistor and the eleventh current terminal.

5. The error amplifier of claim 1, further comprising a cascode circuit coupled between the second stage circuit and a ground terminal.

6. The error amplifier of claim 1, wherein:
   the circuit has a first circuit input and a second circuit input;
   the first circuit input is coupled to the first resistor and to the first current terminal; and
   the second circuit input is coupled to the second resistor and to the third current terminal.

7. A voltage regulator, comprising:
   a first transistor having a first control input, a first current terminal, and a second current terminal;
   an error amplifier including:
      a first stage circuit including a first resistor, a second resistor, and a differential input pair of transistors, at least one transistor of the differential input pair of transistors coupled to the second current terminal;
      a second stage circuit coupled to the first and second resistors, the second stage circuit having an error amplifier output coupled to the first control input, the second stage circuit configured to cause less current to flow through the second stage circuit than a current that flows through either of the first or second resistors or the differential input pair of transistors;
      a second transistor having a second control input and third and fourth current terminals, the third current terminal coupled to the first resistor;
      a third transistor having a third control input and fifth and sixth current terminals, the fifth current terminal coupled to the second resistor;
      a third resistor coupled between the first resistor and the third current terminal; and
      a fourth resistor coupled between the second resistor and the sixth current terminal.

8. The voltage regulator of claim 7, further comprising an attenuator circuit, the attenuator circuit including a first attenuator circuit input, a second attenuator circuit input, a first attenuator circuit output, and a second attenuator circuit output, the first attenuator circuit input coupled to the first resistor and to at least one transistor of the differential input pair of transistors, the second attenuator circuit input coupled to the second resistor and to at least one other transistor of the differential input pair of transistors, the first attenuator circuit output coupled to the second control input, and the second attenuator circuit output coupled to the third control input.

9. The voltage regulator of claim 8, wherein the attenuator circuit includes:
   a fourth transistor having a fourth control input and seventh and eighth current terminals, the seventh current terminal coupled to the second control input;
   a fifth transistor having a fifth control input and ninth and tenth current terminals, the ninth current terminal coupled to the third control input;
   a sixth transistor having a sixth control input and eleventh and twelfth current terminals, the sixth control input coupled to the first resistor, and the twelfth current terminal coupled to the fourth control input;
   a seventh transistor having a seventh control input and thirteenth and fourteenth current terminals, the seventh control input coupled to the second resistor, and the fourteenth current terminal coupled to the fifth control input; and
   a bias voltage circuit coupled to the seventh current terminal and to the ninth current terminal.

10. The voltage regulator of claim 8, wherein the attenuator circuit includes:
   a fourth transistor having a fourth control input and seventh and eighth current terminals, the seventh current terminal coupled to the second control input;
   a fifth transistor having a fifth control input and ninth and tenth current terminals, the ninth current terminal coupled to the third control input;
   a sixth transistor having a sixth control input and eleventh and twelfth current terminals, the sixth control input coupled to the first resistor, and the twelfth current terminal coupled to the fourth control input;
   a seventh transistor having a seventh control input and thirteenth and fourteenth current terminals, the seventh control input coupled to the second resistor, and the fourteenth current terminal coupled to the fifth control input;
a third resistor;
a fourth resistor;
a first bias voltage circuit coupled to the third resistor and to the seventh current terminal; and
a second bias voltage circuit coupled to the fourth resistor and to the ninth current terminal.

11. The voltage regulator of claim 7, wherein:
the second stage circuit has a first second stage circuit input and a second second stage circuit input;
the first second stage circuit input is coupled to the first resistor and to a transistor of the differential input pair of transistors; and
the second second stage circuit input is coupled to the second resistor and to another transistor of the differential input pair of transistors.

12. A circuit, comprising:
a first transistor having a first control input, a first current terminal, and a second current terminal;
a second transistor having a second control input, a third current terminal, and a fourth current terminal;
a first resistor coupled between a supply voltage terminal and the first current terminal;
a second resistor coupled between the supply voltage terminal and the third current terminal;
a third transistor having a third control input, a fifth current terminal, and a sixth current terminal, the fifth current terminal coupled to the first resistor and to the first current terminal;
a fourth transistor having a fourth control input, a seventh current terminal, and an eighth current terminal, the seventh current terminal coupled to the second resistor and to the third current terminal; and
an attenuator circuit having a first input and a second input, the first input of the attenuator circuit coupled to the first current terminal and the first resistor, the second input of the attenuator circuit coupled to the third current terminal and the second resistor, and the attenuator circuit coupled to the third and fourth control inputs.

13. The circuit of claim 12, wherein the third and fourth transistors are configured such that less current flows through the third and fourth transistors than through the first and second transistors.

14. The circuit of claim 12, wherein the attenuator circuit is configured to reduce a transconductance associated with the third and fourth transistors.

15. The circuit of claim 14, wherein the attenuator circuit includes:
a fifth transistor having a fifth control input and ninth and tenth current terminals;
a sixth transistor having a sixth control input and eleventh and twelfth current terminals;
a seventh transistor having a seventh control input and thirteenth and fourteenth current terminals, the seventh control input coupled to the first current terminal and to the first resistor, and the fourteenth current terminal coupled to the fifth control input;
an eighth transistor having an eighth control input and fifteenth and sixteenth current terminals, the eighth control input coupled to the third current terminal and to the second resistor, and the sixteenth current terminal coupled to the sixth control input;
a third resistor;
a fourth resistor;
a first bias voltage circuit coupled to the third resistor and the ninth current terminal; and
a second bias voltage circuit coupled to the fourth resistor and the eleventh current terminal.

16. The circuit of claim 12, further comprising:
a fifth transistor having a fifth control input and ninth and tenth current terminals, the ninth current terminal coupled to the third control input;
a sixth transistor having a sixth control input and eleventh and twelfth current terminals, the eleventh current terminal coupled to the fourth control input;
a seventh transistor having a seventh control input and thirteenth and fourteenth current terminals, the seventh control input coupled to the first current terminal and to the first resistor, and the fourteenth current terminal coupled to the fifth control input;
an eighth transistor having an eighth control input and fifteenth and sixteenth current terminals, the eighth control input coupled to the third current terminal and to the second resistor, and the sixteenth current terminal coupled to the sixth control input;
a bias voltage circuit;
a third resistor coupled between the bias voltage circuit and the ninth current terminal; and
a fourth resistor coupled between the bias voltage circuit and the eleventh current terminal.

* * * * *